United States Patent
Saito et al.

(10) Patent No.: US 10,515,016 B2
(45) Date of Patent: Dec. 24, 2019

(54) METHOD AND APPARATUS FOR CACHING IN SOFTWARE-DEFINED STORAGE SYSTEMS

(71) Applicant: Hitachi, Ltd., Chiyoda-ku, Tokyo (JP)

(72) Inventors: Hideo Saito, Santa Clara, CA (US); Keisuke Hatasaki, Santa Clara, CA (US)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 15/755,036

(22) PCT Filed: Dec. 3, 2015

(86) PCT No.: PCT/US2015/063831
§ 371 (c)(1),
(2) Date: Feb. 23, 2018

(87) PCT Pub. No.: WO2017/095429
PCT Pub. Date: Jun. 8, 2017

(65) Prior Publication Data
US 2018/0253383 A1 Sep. 6, 2018

(51) Int. Cl.
*G06F 12/0871* (2016.01)
*G06F 12/02* (2006.01)
*G11C 14/00* (2006.01)

(52) U.S. Cl.
CPC ...... *G06F 12/0871* (2013.01); *G06F 12/0238* (2013.01); *G11C 14/0009* (2013.01); *G06F 2212/205* (2013.01); *G06F 2212/7203* (2013.01)

(58) Field of Classification Search
CPC ............ G06F 12/0871; G06F 12/0238; G06F 2212/205; G06F 2212/7203; G11C 14/0009
See application file for complete search history.

(56) References Cited

U.S. PATENT DOCUMENTS

| | | |
|---|---|---|
| 2006/0015688 A1 | 1/2006 | Schnapp et al. |
| 2007/0150647 A1 | 6/2007 | Shin et al. |
| 2011/0153903 A1* | 6/2011 | Hinkle ............... G06F 13/20 710/313 |

(Continued)

FOREIGN PATENT DOCUMENTS

CN 100357873 C 12/2007

OTHER PUBLICATIONS

International Search Report for related PCT Application PCT/US2015/063831 dated Mar. 2, 2016.

*Primary Examiner* — Charles Rones
*Assistant Examiner* — Tong B. Vo
(74) *Attorney, Agent, or Firm* — Procopio, Cory, Hargreaves & Savitch LLP (57) ABSTRACT

Examples implementations described herein involve systems and methods wherein the storage software is configured to consider the capabilities of the underlying hardware to determine the caching data method at run time. Some examples of capabilities that are considered in the example implementations include whether non-volatile memory (NVM) is available and how much NVM is available. Some examples of caching methods used include using both dynamic random access memory (DRAM) and NVM to cache write data and using only NVM to cache write data.

7 Claims, 11 Drawing Sheets

(56) References Cited

U.S. PATENT DOCUMENTS

| | | | | |
|---|---|---|---|---|
| 2013/0318283 A1* | 11/2013 | Small | ................. | G06F 12/0246 |
| | | | | 711/103 |
| 2014/0189203 A1* | 7/2014 | Suzuki | ................ | G06F 12/0246 |
| | | | | 711/103 |
| 2014/0304475 A1* | 10/2014 | Ramanujan | ......... | G06F 12/0895 |
| | | | | 711/128 |

* cited by examiner

METHOD AND APPARATUS FOR CACHING IN SOFTWARE-DEFINED STORAGE SYSTEMS

CROSS-REFERENCE TO RELATED APPLICATIONS

This application is a U.S. National Stage entry of PCT Application No: PCT/US2015/063831 filed Dec. 3, 2015, the contents of which are incorporated herein by reference.

BACKGROUND

Field

The present disclosure is generally related to storage systems, and more specifically, to implementations of caching in software defined storage systems.

Related Art

In the related art, non-volatile memory (NVM) has Input/Output (I/O) performances that are close to that of dynamic random access memory (DRAM). Some examples of NVM include magnetic RAM (MRAM) and phase change RAM (PCRAM).

In the related art, there is a trend towards using commodity hardware in data centers. For example, in a related art implementation, there is a storage apparatus that caches write data in NVM so as to preserve data even when electricity is interrupted is described. In another related art implementation, there is a storage apparatus that monitors standby power state changes and toggles the write cache mode. When a battery backup can be performed, the storage apparatus performs write back caching, whereas when battery backup cannot be performed, the storage apparatus performs write through caching.

Thus in the related art, NVM is used as an extension to DRAM for data caching in storage systems. Such implementations may lower the cost per bit for caching. Storage functionality is provided as software, allowing commodity hardware to be used for storage (software-defined storage).

SUMMARY

However, in related art implementations, the storage software may not take into account the difference in capabilities of the hardware on which the storage software is executed. As a result, storage software may not make the best use of the available hardware. For example, hardware with battery backup for DRAM can use DRAM for write caching without losing data upon power loss, but hardware without battery backup for DRAM should use NVM for write caching to prevent losing data upon power loss.

In example implementations of the present disclosure, the storage software is configured to consider whether NVM is available in order to determine where to cache write data. Further, in example implementations, the storage software is configured to consider how much NVM is available in order to determine how much DRAM to use for caching read data and for caching write data.

In example implementations, there is a method and apparatus that allows software-defined storage to fully take advantage of the hardware on which the software-defined storage runs.

Aspects of the example implementations includes a storage server, which may involve a memory configured to store information associating an input/output (I/O) request operation type to one or more parameters indicative of availability of a cache type, the cache type including at least one of non-volatile memory (NVM) and dynamic random access memory (DRAM), the information generated from a detection of a hardware configuration of the storage server; and a processor, configured to select a cache mode for the I/O request operation type based on the one or more parameters indicative of the availability of the cache type associated with the I/O request operation type, and for receipt of an I/O request operation being the I/O request operation type, process the I/O request operation according to the selected cache mode.

Aspects of the example implementations involve a method for a storage server, which may involve managing information associating an input/output (I/O) request operation type to one or more parameters indicative of availability of a cache type, the cache type including at least one of non-volatile memory (NVM) and dynamic random access memory (DRAM), the information generated from a detection of a hardware configuration of the storage server; selecting a cache mode for the I/O request operation type based on the one or more parameters indicative of the availability of the cache type associated with the I/O request operation type, and for receipt of an I/O request operation being the I/O request operation type, processing the I/O request operation according to the selected cache mode.

Aspects of the example implementations involve a computer program storing instructions for executing a process for a storage server. The instructions may include managing information associating an input/output (I/O) request operation type to one or more parameters indicative of availability of a cache type, the cache type including at least one of non-volatile memory (NVM) and dynamic random access memory (DRAM), the information generated from a detection of a hardware configuration of the storage server; selecting a cache mode for the I/O request operation type based on the one or more parameters indicative of the availability of the cache type associated with the I/O request operation type, and for receipt of an I/O request operation being the I/O request operation type, processing the I/O request operation according to the selected cache mode. The computer program may be stored on a non-transitory computer readable medium for execution by one or more processors.

Aspects of the example implementations includes an apparatus, which may involve means for storing information associating an input/output (I/O) request operation type to one or more parameters indicative of availability of a cache type, the cache type including at least one of non-volatile memory (NVM) and dynamic random access memory (DRAM), the information generated from a detection of a hardware configuration of the apparatus; and means for selecting a cache mode for the I/O request operation type based on the one or more parameters indicative of the availability of the cache type associated with the I/O request operation type, and means for, for receipt of an I/O request operation being the I/O request operation type, processing the I/O request operation according to the selected cache mode.

DETAILED DESCRIPTION

The following detailed description provides further details of the figures and example implementations of the present application. Reference numerals and descriptions of redundant elements between figures are omitted for clarity. Terms used throughout the description are provided as examples and are not intended to be limiting. For example, the use of the term "automatic" may involve fully automatic or semi-automatic implementations involving user or administrator control over certain aspects of the implementation, depending on the desired implementation of one of ordinary skill in the art practicing implementations of the present application. The terms "request" and "operation" may also be used interchangeably.

In a first example implementation, there is storage software that is configured to vary the location for caching data based on the capabilities of the underlying hardware.

Figure 1:
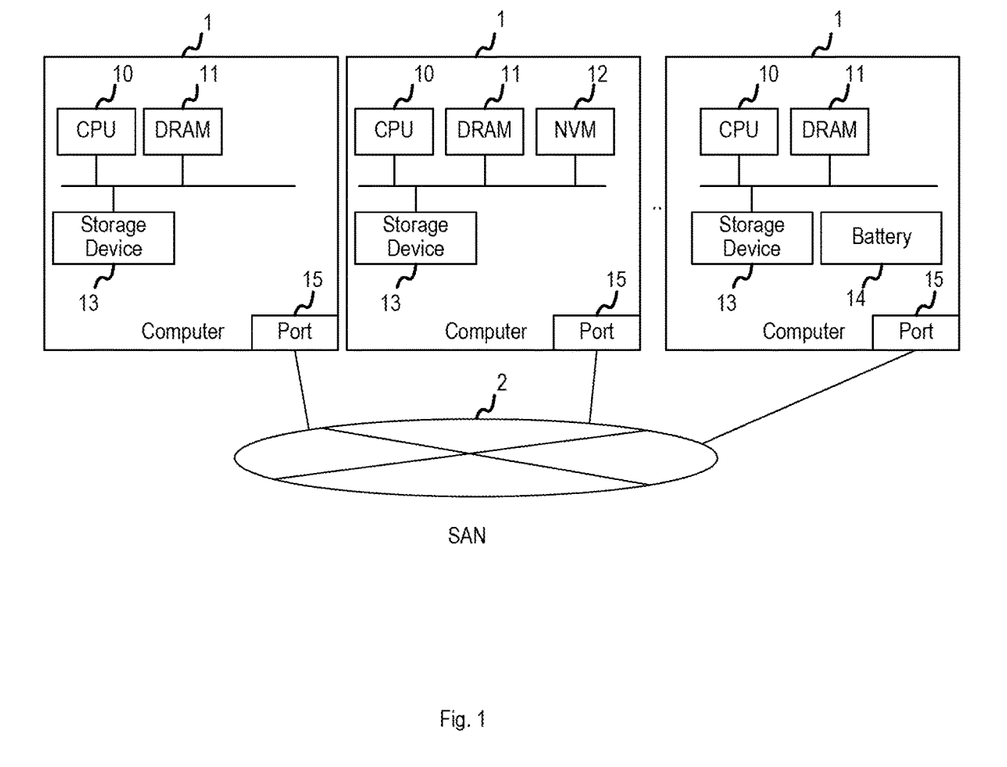
FIG. 1 illustrates an example of the physical configuration of the system in which example implementations may be applied.

FIG. 1 illustrates an example of the physical configuration of the system in which the example implementations may be applied. In the example of FIG. 1, multiple computers 1 are connected to each other via a storage area network (SAN) 2. Computer 1 can include one or more central processing units (CPUs) 10, DRAM 11, one or more storage devices 13 and one or more ports 15. Computer 1 may also include NVM 12. In the event of power loss, data stored in DRAM 11 is lost, but data stored in NVM 12 is preserved. Storage device 13 may involve hard disk drives (HDDs), solid state drives (SSDs) or any other types of storage devices. Computer 1 may also include battery 14. In the event of power loss, battery 14 provides power to computer 1 so that data stored in DRAM 11 can be backed up to storage device 13.

SAN 2 may be a Fibre Channel network or an Ethernet network. Each computer 1 is connected to SAN 2 through one or more of its ports 15. Each computer 1 may be used as a host computer that runs application software on CPU 10, a storage server that runs storage software on CPU 10, or a management server that runs storage management software on CPU 10. The computer 1 that is configured as a host computer sends I/O requests to the computer 1 that is configured as a storage server. I/O request can include read request and write requests.

The computer 1 that is configured as a storage server processes a read request by reading data from an internal storage device 13 and sending the data to the computer 1 that sent the read request. The computer 1 that is configured as a storage server processes a write request by receiving data from the computer 1 that sent the write request and writing the data to an internal storage device 13.

Figure 3:
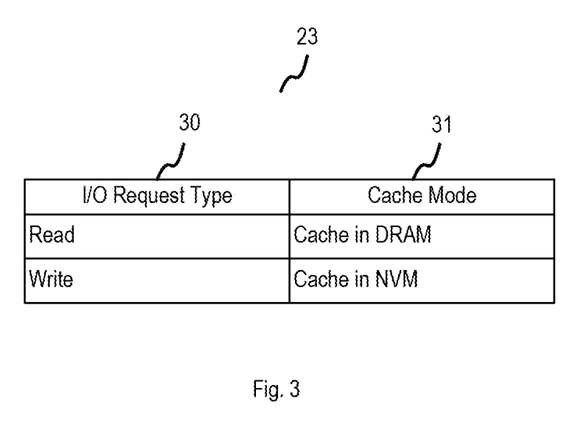
FIG. 3 shows the logical layout of the Cache Mode Management Table, in accordance with an example implementation.
Figure 4:
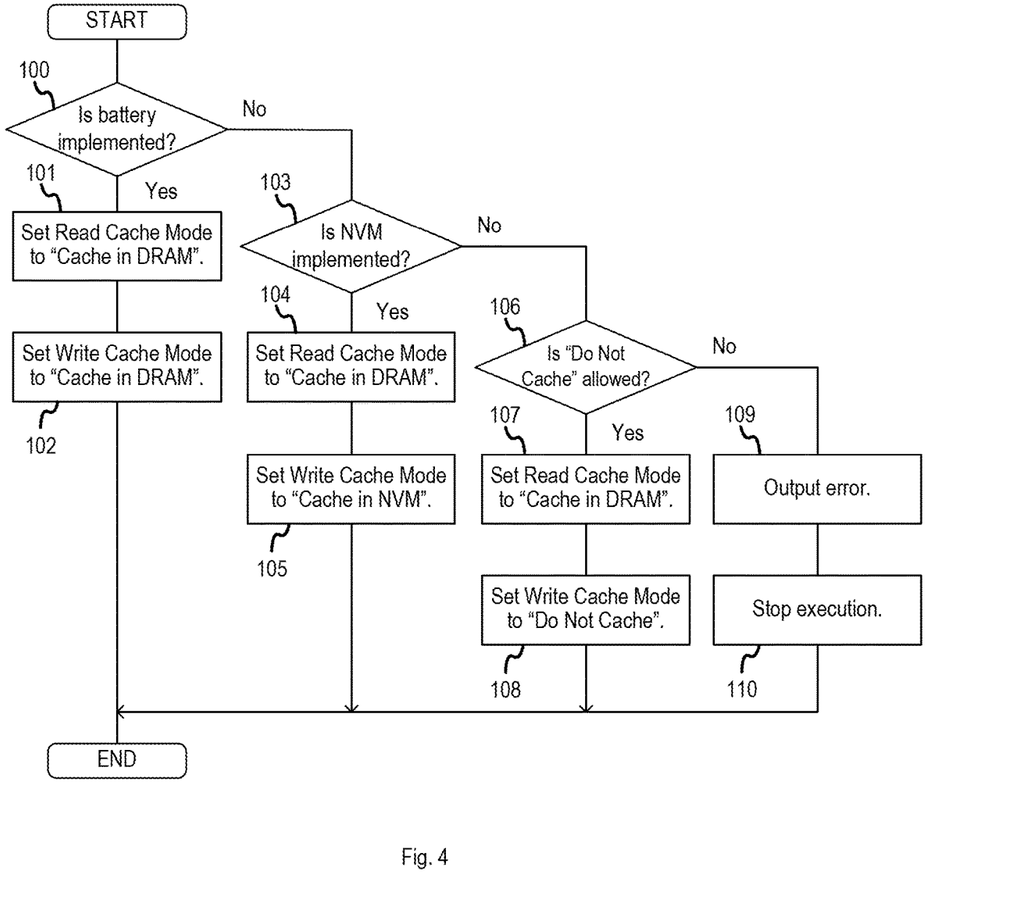
FIG. 4 illustrates an example flow diagram for Initialization Program, in accordance with an example implementation.
Figure 9:
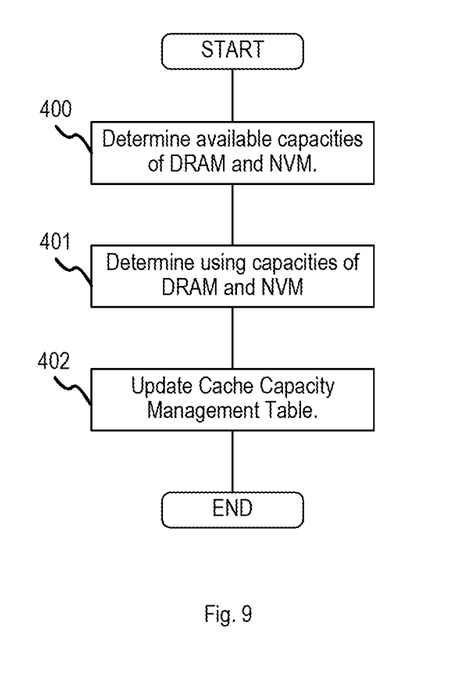
FIG. 9 illustrates an example flow chart of the Initialization Program, in accordance with an example implementation.

For the computer 1 that is configured as a storage server, the computer 1 may involve a memory (e.g., DRAM 11, NVM 12 or storage device 13) configured to store information associating an input/output (I/O) request operation type to one or more parameters indicative of availability of a cache type, with the cache type being at least one of one of non-volatile memory (NVM) and dynamic random access memory (DRAM) as illustrated in FIG. 3. Such information can generated from a detection of a hardware configuration of the storage server depending on the desired implementation. CPU 10 may be configured to select a cache mode for the I/O request operation type based on the one or more parameters indicative of the availability of the cache type associated with the I/O request operation type as illustrated in FIG. 4 and FIG. 9. For receipt of an I/O request operation being the I/O request operation type, the CPU 10 may be configured to process the I/O request operation according to the selected cache mode, as illustrated in FIGS. 5, 6, 10, and 11.

Figure 8:
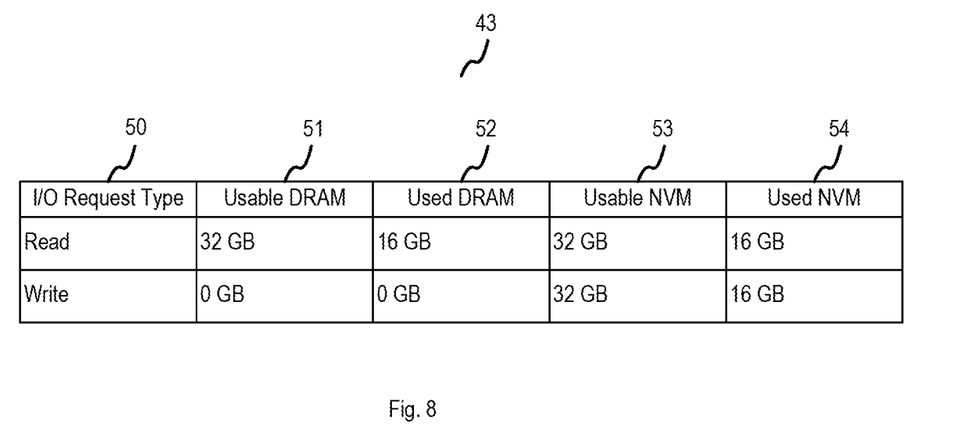
FIG. 8 illustrates the logical layout of Cache Capacity Management Table, in accordance with an example implementation.

For the computer 1 that is configured as a storage server, CPU 10 may be configured to select the cache mode for the I/O request operation type by, for the one or more parameters indicative of availability of NVM in the storage server, set the cache mode to NVM caching for the I/O request operation type of a write operation as illustrated in FIG. 4 or FIG. 9. As example, CPU 10 can be configured, for the one or more parameters indicative of non-availability of NVM in the storage server and of non-availability of backup operations for DRAM caching, to set the cache mode to non-caching for the I/O request operation type of the write operation as illustrated in FIG. 4 and FIG. 9. The parameters can include availability or non-availability of battery support for DRAM as illustrated in FIG. 4, existence of usable cache capacity for NVM or DRAM as illustrated in FIG. 9, and other examples in accordance with the desired implementation. Further, CPU 10 can be configured to select the cache mode for the I/O request operation type by, for the one or more parameters indicative of availability of battery support for DRAM, setting the cache mode to DRAM caching for the I/O request operation type of a write operation as illustrated in FIG. 4. Further, CPU 10 can be configured to calculate the usable NVM cache capacity and the usable DRAM capacity from available NVM cache capacity and available DRAM cache capacity as illustrated in FIG. 8.

As illustrated in FIGS. 3 and 4, the cache mode can include caching in NVM, caching in DRAM, and non-caching (e.g. direct read or write to storage device 13), and the I/O request operation type can include the read operation and the write operation. Other operations may also be included in example implementations depending on the desired implementation, and the present disclosure is not limited to read or write operations.

Figure 2:
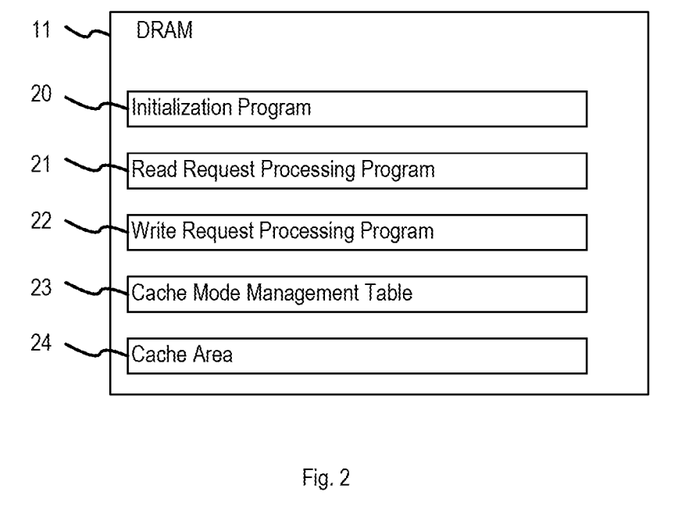
FIG. 2 illustrates the logical layout of DRAM when the computer is configured as a storage server, in accordance with an example implementation.

FIG. 2 illustrates the logical layout of DRAM 11 when the computer 1 is configured as a storage server, in accordance with an example implementation. When the computer 1 is configured as a storage server, DRAM 11 includes Initialization Program 20, Read Request Processing Program 21, Write Request Processing Program 22, Cache Mode Management Table 23 and Cache Area 24.

Initialization Program 20 is executed by CPU 10 when the computer 1 that is configured as a storage server is powered on. Initialization Program 20 initializes Cache Mode Management Table 23. Initialization Program 20 may also be executed when there is a hardware state change. An example of a hardware state change is the addition or removal of NVM 12 or battery 14. Another example of a hardware state change includes the failure of NVM 12 or battery 14. An example implementation of the flow diagram for Initialization Program 20 is provided in FIG. 4 and FIG. 9.

Read Request Processing Program 21 is executed by CPU 10 when the computer 1 that is configured as a storage server receives a read request from the computer 1 that is configured as a host computer. Read Request Processing Program 21 reads data from Storage Device 13 and sends it to the computer 1 that is configured as a host computer. Read Request Processing Program 21 may temporarily cache the read data in Cache Area 24, so that future read requests for the same data have low response times. Read data cached in Cache Area 24 is deleted from Cache Area 24 either by a periodic process that lowers the usage of Cache Area 24 or by the Read Request Processing Program 21 while processing a future read request. An example implementation of the flow diagram for Read Request Processing Program 21 is provided in FIG. 5 and FIG. 10.

Write Request Processing Program 22 is executed by CPU 10 when the computer 1 that is configured as a storage server receives a write request from the Computer 1 that is configured as a host computer. Write Request Processing Program 22 receives data from the computer 1 that is configured as a host computer and writes it to storage device 13. Write Request Processing Program 22 may temporarily cache the write data in Cache Area 24 and send a response to the computer 1 that is configured as a host computer, so that the write request has a low response time. Write data cached in Cache Area 24 is written to storage device 13 and is deleted from Cache Area 24 either by a periodic process that lowers that usage of Cache Area 24 or by Write Request Processing Program 22 while processing a future write request. An example of a flow diagram of Write Request Processing Program 22 is provided in FIG. 6 and FIG. 11.

When the computer 1 that is configured as a storage server has NVM 12, Read Request Processing Program 21 and Write Request Processing Program 22 may use NVM 12 instead of, or in addition to, Cache Area 24 to cache read data and/or write data.

Read Request Processing Program 21 and Write Request Processing Program refer to Cache Mode Management Table 23 to determine whether to cache read and write data, and the location at which to cache read and write data.

FIG. 3 illustrates the logical layout of the Cache Mode Management Table 23, in accordance with an example implementation. Cache Mode Management Table 23 is used by Read Request Processing Program 21 and Write Request Processing Program 22 to determine whether to cache read data and write data and the location to cache read and write data. Cache Mode Management Table 23 includes multiple entries. Each entry can involve I/O Request Type 30 and Cache Mode 31. I/O Request Type 30 is used to identify the type of I/O request that is received from Computer 1 that is configured as a host computer. Example values of I/O Request Type 30 are "Read" and "Write". Cache Mode 31 denotes the caching method for the type of I/O request identified by I/O Request Type 30. Example values of Cache Mode 31 are "Cache in DRAM", "Cache in NVM" and "Do Not Cache", however, the present disclosure is not limited to these values, and other values may also be utilized depending on the underlying hardware and the desired implementation.

FIG. 4 illustrates an example flow diagram for Initialization Program 20, in accordance with an example implementation. The flow begins at 100, wherein the Initialization Program 20 determines if battery 14 is implemented or not by performing a hardware probe. Alternatively, the Initialization Program 20 may determine if battery 14 is implemented or not by referring to an administrator supplied configuration file stored in Storage Device 13, or by other methods depending on the desired implementation. If the battery 14 is implemented, the Initialization Program 20 may additionally test whether battery 14 is operational or not by querying the battery 14. If the battery 14 is not operational, the Initialization Program 20 determines battery 14 to be not implemented even if the battery 14 exists physically.

If the battery 14 is determined to be implemented (Yes), then the flow proceeds to 101, wherein the Initialization Program 20 locates the entry with the I/O Request Type 30 of "Read" in Cache Mode Management Table 23 and sets the Cache Mode 31 to "Cache in DRAM". The flow then proceeds to 102, wherein the Initialization Program 20 locates the entry with the I/O Request Type 30 of "Write" in Cache Mode Management Table 23 and sets the Cache Mode 31 to "Cache in DRAM".

If the battery 14 is determined not to be implemented (No), then the flow proceeds to 103, wherein the Initialization Program 20 determines if the NVM 12 is implemented or not by performing a hardware probe. Alternatively, the Initialization Program 20 may determine if the NVM 12 is implemented or not by referring to an administrator supplied configuration file stored in Storage Device 13, or by other methods depending on the desired implementation. If the NVM 12 is implemented, the Initialization Program 20 may additionally test whether the NVM 12 is operational or not by querying the NVM 12. If the NVM 12 is not operational, then the Initialization Program 20 determines that the NVM 12 is not implemented even if it exists physically.

If the NVM 12 is determined to be implemented (Yes), then the flow proceeds to 104, wherein the Initialization Program 20 locates the entry with the I/O Request Type 30 of "Read" in Cache Mode Management Table 23 and sets the Cache Mode 31 to "Cache in DRAM". The flow then proceeds to 105, wherein the Initialization Program 20 locates the entry with the I/O Request Type 30 of "Write" in Cache Mode Management Table 23 and sets the Cache Mode 31 to "Cache in NVM".

If the NVM 12 is determined not to be implemented (No), then the flow proceeds to 106, wherein the Initialization Program 20 determines if the "Do Not Cache" option is permitted in the storage computer configuration. If the "Do Not Cache" option is permitted (Yes), then the flow proceeds to 107 wherein the Initialization Program 20 locates the entry with the I/O Request Type of "Read" in Cache Mode Management Table 23 and sets the Cache Mode 31 to "Cache in DRAM". The flow then proceeds to 108, wherein the Initialization Program 20 locates the entry with the I/O Request Type 30 of "Write" in Cache Mode Management Table 23 and sets the Cache Mode 31 to "Do Not Cache". Otherwise, if the "Do Not Cache" option is not permitted (No) then the flow proceeds to 109 to output an error message and then proceeds to 110 to stop the configuration of computer 1 to be a storage server.

Alternatively, the Initialization Program 20 may prevent further execution of storage software on Computer 1. This prevents Computer 1 from becoming a storage server with poor write performance. As another alternative, the Initialization Program 20 may notify the Computer 1 configured as a management server that Computer 1 configured as the storage server has poor write performance. This allows a storage administrator to remedy the situation, for example by adding Battery 14 or NVM 12 Computer 1.

Initialization Program 20 may set Cache Mode Management Table 23 to different values from those described above, based on different objectives and the desired implementation. For example, Initialization Program 20 may set Cache Mode 31 to "Cache in NVM" in the flow at 104 and Cache Mode 31 to "Cache in DRAM" in the flow 105. Such implementations can be effective in cases where NVM 12 has a higher response time for writes than for reads.

Figure 5:
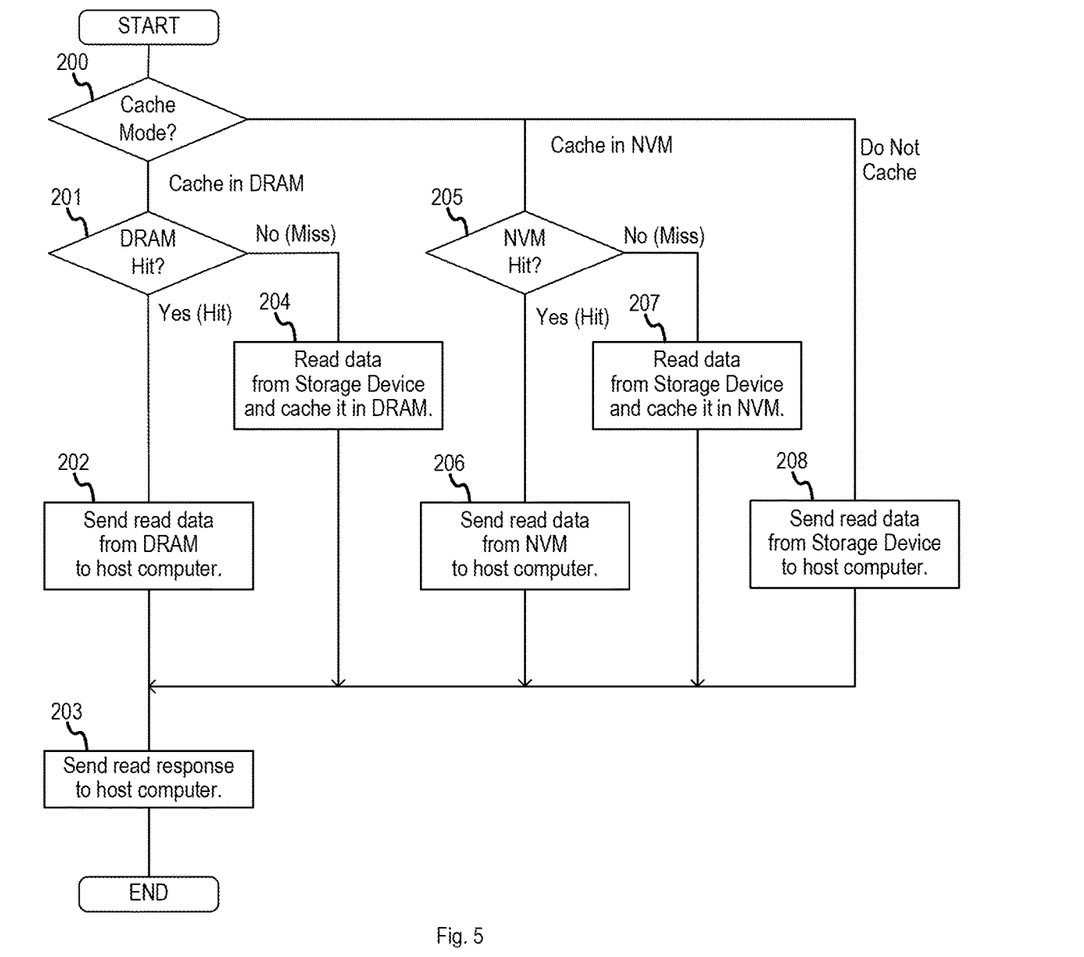
FIG. 5 illustrates an example flow diagram of Read Request Processing Program, in accordance with an example implementation.

FIG. 5 illustrates an example flow diagram of Read Request Processing Program 21, in accordance with an example implementation. The flow begins at 200, wherein the Read Request Processing Program 21 determines the cache mode by referring to Cache Mode Management Table 23 and locating the entry with the I/O Request Type 30 of "Read".

If the corresponding Cache Mode 31 is "Cache in DRAM", then the flow proceeds to 201, wherein the Read Request Processing Program 21 determines whether the requested read data resides in Cache Area 24. If the requested read data is in the Cache Area 24 (Yes), then a cache hit has occurred, and the flow proceeds to 202 wherein the Read Request Processing Program 21 sends the requested read data from Cache Area 24 to the Computer 1 that sent the read request. The flow then proceeds to 203, wherein the Read Request Processing Program 21 sends a read response to the Computer 1 that sent the read request. If the requested read data is not in the Cache Area 24 (No), then a cache miss has occurred, and the flow proceeds to 204, wherein the Read Request Processing Program 21 reads the requested read data from Storage Device 13 and caches it in Cache Area 24. The flow then proceeds to 203.

If the corresponding Cache Mode 31 is "Cache in DRAM", then the flow proceeds to 205, wherein the Read Request Processing Program 21 determines whether the requested read data resides in the NVM 12. If the requested read data does reside in the NVM 12 (Yes), then a cache hit has occurred and the flow proceeds to 206, wherein the Read Request Processing Program 21 sends the requested read data from NVM 12 to the Computer 1 that sent the read request. If the requested read data does not reside in the NVM 12 (No), then a cache miss has occurred, and the flow proceeds to 207 wherein the Read Request Processing Program 21 reads the requested read data from storage device 13 and caches the read data in the NVM 12. The flow then proceeds to 203.

If the corresponding Cache Mode 31 is "Do Not Cache", then the flow proceeds to 208, wherein the Read Request Processing Program 21 sends the requested read data from Storage Device 13 to the Computer 1 that sent the read request.

Figure 6:
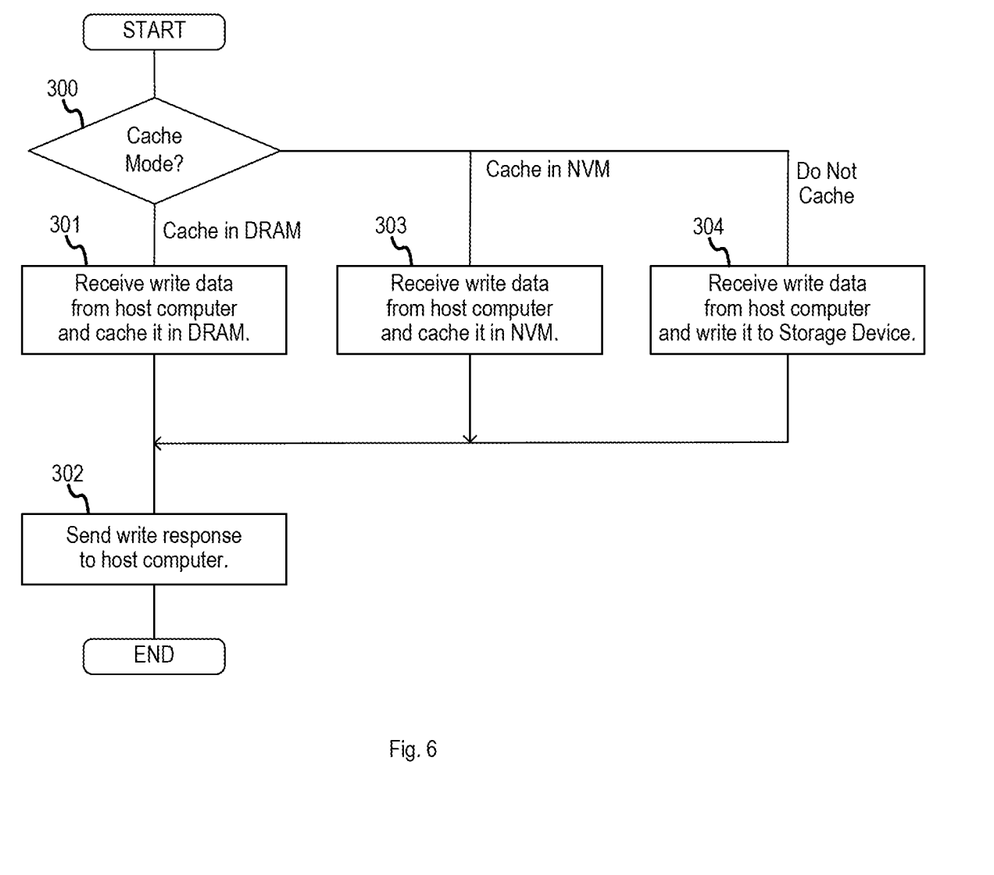
FIG. 6 illustrates an example flow diagram for Write Request Processing Program, in accordance with an example implementation.

FIG. 6 illustrates an example flow diagram for Write Request Processing Program 22, in accordance with an example implementation. The flow begins at 300, wherein the write Request Processing Program 22 determines the cache mode by referring to Cache Mode Management Table 23 and locating the entry with the I/O Request Type 30 of "Write".

If the corresponding Cache Mode 31 is "Cache in DRAM" then the flow proceeds to 301, wherein the Write Request Processing Program 22 receives the requested write data from the Computer 1 that sent the write request and caches the write data in Cache Area 24. The flow then proceeds to 302, wherein the Write Request Processing Program 22 sends a write response to the Computer 1 that sent the write request.

If the corresponding Cache Mode 31 is "Cache in NVM", then the flow proceeds to 303, wherein the Write Request Processing Program 22 receives the requested write data from the Computer 1 that sent the write request and caches the write data in NVM 12. The flow then proceeds to 302.

If the corresponding Cache Mode 31 is "Do Not Cache", then the flow proceeds to 304, wherein the Write Request Processing Program 22 receives the requested write data from the Computer 1 that sent the write request and writes the write data to storage device 13. The flow then proceeds to 302.

In a second example implementation of the present disclosure, the storage software can be configured to vary where data is cached based on the available capacity of different memory types. The physical configuration of the system can be the same as that in the first example implementation described above. The differences in the logical configuration of the system and how the system is controlled are described below.

Figure 7:
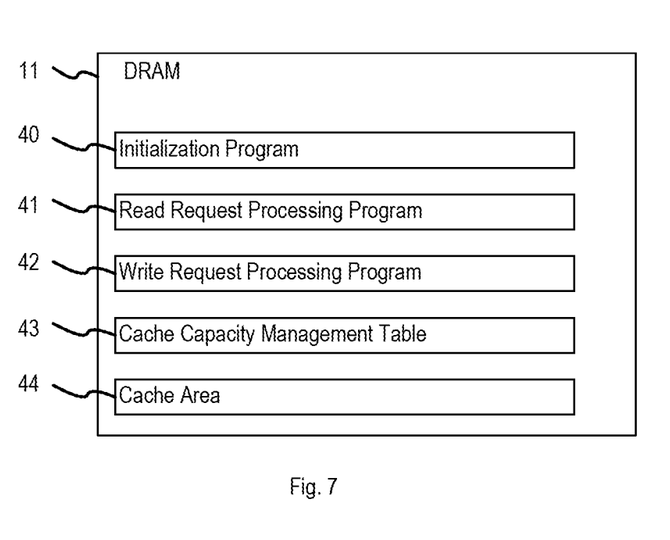
FIG. 7 illustrates the logical layout of DRAM when the computer is configured as a storage server, in accordance with an example implementation.

FIG. 7 illustrates the logical layout of DRAM 11 when the computer 1 is configured as a storage server, in accordance with an example implementation. When the computer 1 is configured as a storage server, the DRAM 11 includes Initialization Program 40, Read Request Processing Program 41, Write Request Processing Program 42, Cache Mode Management Table 43 and Cache Area 44.

Initialization Program 40 is executed by CPU 10 when the computer 1 that is configured as a storage server is powered on. Initialization Program 40 may also be executed when there is a hardware state change. An example of a hardware state change is addition or reduction of DRAM 11 or NVM 12.

Read Request Processing Program 41 is executed by CPU 10 when the computer 1 that is configured as a storage server receives a read request from a computer 1 that is configured as a host computer. Write Request Processing Program 42 is executed by CPU 10 when computer 1 that is configured as a storage server receives a write request from the computer 1 that is configured as a host computer. Read Request Processing Program 41 and Write Request Processing Program 42 basically work the same way as Read Request Processing Program 21 and Write Request Processing Program 22 respectively, but the difference in this example implementation is that Read Request Processing Program 41 and Write Request Processing Program 42 refer to Cache Capacity Management Table 43 to determine where to cache read and write data. Cache Area 44 can be configured the same as Cache Area 24, or adjusted according to the desired implementation to implement the present example implementation.

FIG. 8 illustrates the logical layout of Cache Capacity Management Table 43, in accordance with an example implementation. The Cache Capacity Management Table 43 is used by Read Request Processing Program 41 and Write Request Processing Program 42 to determine where to cache read and write data. Cache Capacity Management Table 43 can include multiple entries. Each entry may include I/O Request Type 50, Usable DRAM 51, Used DRAM 52, Usable NVM 53 and Used NVM 54. I/O Request Type 50 is used to identify the type of I/O request that is received from Computer 1 that is configured as a host computer. Example values of I/O Request Type 50 are "Read" and "Write". Usable DRAM 51 denotes the maximum capacity of DRAM 11 that will be used to cache data resulting from the type of I/O request identified by I/O Request Type 50. Used DRAM 52 denotes the current capacity used to cache data resulting from the type of I/O request identified by I/O Request Type 50. Used DRAM 52 increases when data is cached in Cache Area 44 by Read Request Processing Program 41 or Write Request Processing Program 42.

Used DRAM 52 decreases when data cached in Cache Area 44 is deleted, for example by a periodic process. Usable NVM 53 denotes the maximum capacity of NVM 12 that will be used to cache data resulting from the type of I/O request identified by I/O Request Type 50. Used NVM 54 denotes the current capacity used to cache data resulting from the type of I/O request identified by I/O Request Type 50. Used NVM 54 increases when data is cached in NVM 12 by Read Request Processing Program 41 or Write Request Processing Program 42. Used NVM 54 decreases when data cached in NVM 12 is deleted, for example by a periodic process.

FIG. 9 illustrates an example flow chart of Initialization Program 40, in accordance with an example implementation. The flow begins at 400, wherein the Initialization Program 40 determines that available capacities of DRAM 11 and NVM 12 by performing a hardware probe. Alternatively, Initialization Program 40 may determine the available capacities of DRAM 11 and NVM 12 by referring to an administrator supplied configuration file stored in Storage Device 13, or by other methods, depending on the desired implementation. At 401, the Initialization Program 40 determines the usable capacities of DRAM 11 and NVM 12 for read and write caching, based on the available capacities of DRAM 11 and NVM 12 determined in the flow at 400.

One algorithm that can be used in the determination at 401 is to allocate DRAM 11 and NVM 12 evenly to reads and writes. In this algorithm, the usable capacity of DRAM 11 for read caching is the available capacity of DRAM 11 determined in the flow at 400 minus the capacity required for working memory, divided by 2. The usable capacity of NVM 12 for read caching is the available capacity of NVM 12 determined in the flow at 400 divided by 2. The usable capacities of DRAM 11 and NVM 12 for write caching are the same as that for read caching. Another algorithm that can be used in this determination is to allocate a predetermined portion of DRAM 11 to writes. For example, the usable capacity of DRAM 11 for write caching is predetermined to be 12 gigabytes (GB). The usable capacity of DRAM 11 for read caching is the available capacity of DRAM 11 determined in the flow at 400 minus the capacity required for working memory, minus 12 GB. The usable capacity of NVM 12 for read caching is equal to the available capacity of NVM 12 determined in the flow at 400, and the usable capacity of NVM 12 for write caching is 0. Other algorithms may also be utilized depending on the desired implementation.

At 402, the Initialization Program 40 locates the entry with the I/O Request Type 50 of "Read" and sets Usable DRAM 51 and Usable NVM 53 to the values determined in the flow at 401, and Used DRAM 52 and Used NVM 54 to 0. Initialization Program 40 also locates the entry with the I/O Request Type 50 of "Write" and sets Usable DRAM 51 and Usable NVM 53 to the values determined in the flow at 401, and Used DRAM 52 and Used NVM 54 to 0.

Figure 10:
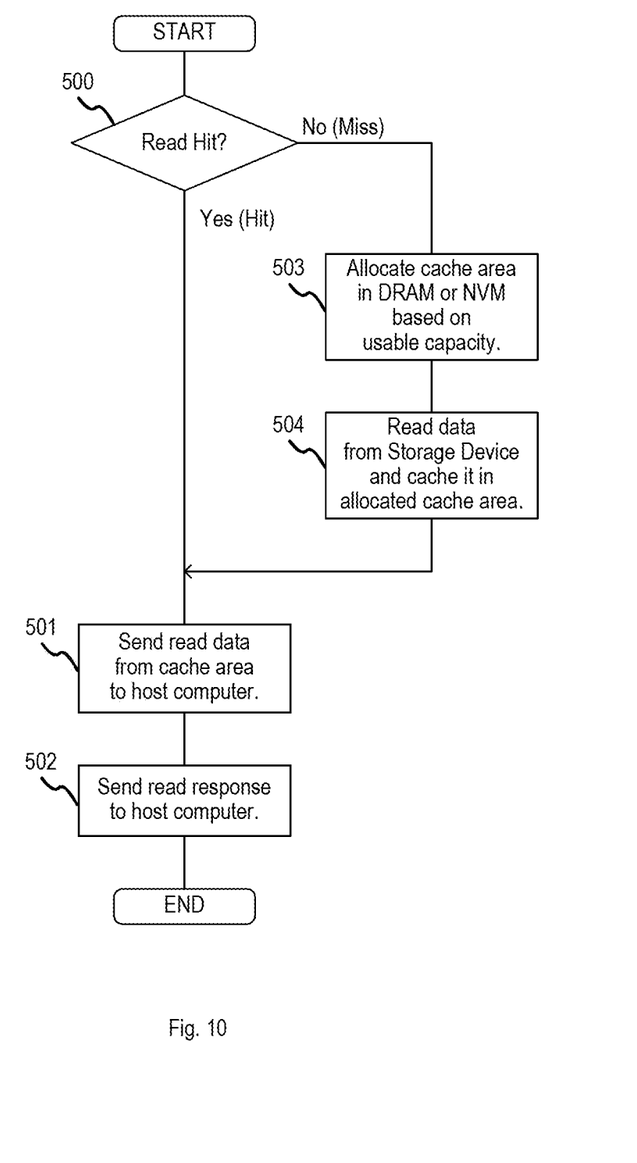
FIG. 10 illustrates an example flow diagram of Read Request Processing Program, in accordance with an example implementation.

FIG. 10 illustrates an example flow diagram of Read Request Processing Program 41, in accordance with an example implementation. The flow begins at 500, wherein the Read Request Processing Program 41 determines whether the requested read data resides in either cache area 44 or NVM 12. If the read data does reside in either the cache area 44 or NVM 12 (Yes), then a cache hit has occurred and the flow proceeds to 501 wherein the Read Request Processing Program 41 sends the requested read data from either cache area 44 or NVM 12, depending on where it is cached, to the computer 1 that sent the read request. The flow then proceeds to 502, wherein the Read Request Processing Program 41 sends a read response to the computer 1 that sent the read request. If the read data does not reside in either the cache area 44 or NVM 12 (No), the a cache miss has occurred and the flow proceeds to 503, wherein the Read Request Processing Program 41 allocates an area in either Cache Area 44 or NVM 12 for caching the requested read data, based on the information in Cache Capacity Management Table 43.

One algorithm that can be used for the allocation at 503 is to prioritize allocation in Cache Area 44, because DRAM 11 tends to be faster than NVM 12. In this algorithm, the Read Request Processing Program 41 locates the entry with the I/O Request Type 50 of "Read" in Cache Capacity Management Table 43 and allocates an area in Cache Area 44 if Usable DRAM 51 of the entry minus Used DRAM 52 of the entry is greater than the requested read data. If an area cannot be allocated in Cache Area 44, the Read Request Processing Program 41 allocates an area in NVM 12 if Usable NVM 53 of the entry minus Used NVM 54 of the entry is greater than the size of the requested read data. If an area can be allocated in neither Cache Area 44 nor NVM 12, the Read Request Processing Program 41 deletes other read data from either Cache Area 44 or NVM 12, and then allocates an area. Another algorithm that can be used for the allocation at 503 is to allocate uniformly from Cache Area 44 and NVM 12. In this algorithm, the Read Request Processing Program 41 locates the entry with the I/O Request Type of "Read" in Cache Capacity Management Table 43 and allocates an area either in Cache Area 44 or NVM 12, where the probabilities of Cache 44 and NVM 12 being selected are proportional to Usable DRAM 52 and Usable NVM 53 of the entry. Other algorithms may also be utilized, depending on the desired implementation.

At 504, the Read Request Processing Program 41 reads the requested read data from storage device 13 and caches the requested read data in the area allocated in the flow at 503. The flow then proceeds to 501.

Figure 11:
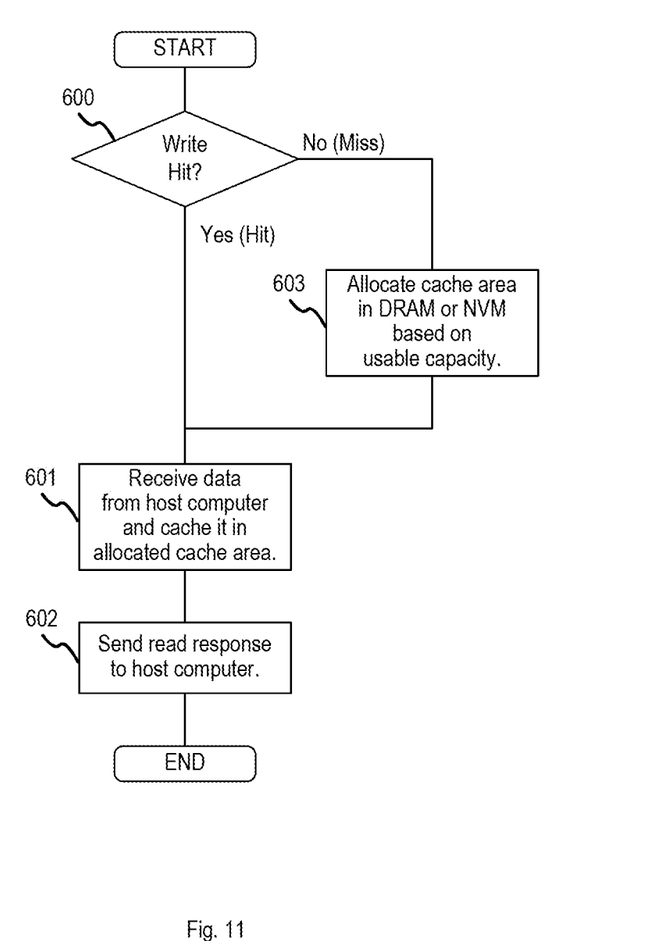
FIG. 11 illustrates an example flow diagram of Write Request Program, in accordance with an example implementation.

FIG. 11 illustrates an example flow diagram of Write Request Program 42, in accordance with an example implementation. The flow begins at 600, wherein the Write Request Processing Program 42 determines whether an older version of the requested write data resides in either cache area 44 or NVM 12. If the write data resides in either cache area 44 or NVM 12 (Yes), then a cache hit has occurred and the flow proceeds to 601, wherein the Write Request Processing Program 42 receives the requested write data from the computer 1 that sent the write request, and caches the write data in Cache Area 44 or NVM 12, depending on the location of the caching area that was allocated. At 602, the Write Request Processing Program 42 sends a write response to the computer 1 that sent the write request.

If the write data does not reside in either the cache area 44 or the NVM 12, then a cache miss has occurred and the flow proceeds to 603, wherein the Write Request Processing Program 42 allocates an area in either the cache area 44 or the NVM 12 for caching the requested write data, based on the information in Cache Capacity Management Table 43. One algorithm that can be used for the allocation at 603 is to prioritize allocation in cache area 44, wherein the DRAM 42 locates the entry with the I/O Request Type 50 of "Write" in Cache Capacity Management Table 32 and allocates an area in the cache area 44 if Usable DRAM 51 of the entry minus Used DRAM 52 of the entry is greater than the size of the requested write data. If an area cannot be allocated in cache area 44, the Write Request Processing Program 42 allocates an area in the NVM 12 if Usable NVM 53 of the entry minus Used NVM 54 of the entry is greater than the size of the requested write data. If an area can be allocated in neither the cache area 44 nor the NVM 12, Write Request Processing Program 42 writes other write data cached in either the cache area 44 or the NVM 12 to storage device 13, deletes the other write data from the cache area 44 or the NVM 12, and then allocates an area.

Another algorithm that can be used for the allocation at 603 is to allocate uniformly from the cache area 44 and the NVM 12. In this algorithm, Write Request Processing Program 42 locates the entry with the I/O Request Type 50 of "Write" in Cache Capacity Management Table 43 and allocates an area either in the cache area 44 or the NVM 12, where the probabilities of the cache area 44 and the NVM 12 being selected are proportional to Usable DRAM 52 and Usable NVM 53 of the entry. The flow then proceeds to 601.

Thus in example implementations, the storage software can be adapted to different hardware configurations. The example implementations may thereby be used to turn customer-owned hardware into a storage server, where the capabilities of the customer-owned hardware might not be known in advance. The example implementations may also be used in a data center where there are multiple kinds of hardware configurations and where it might not be known in advance which one of the hardware configurations will be turned into a storage server.

Some portions of the detailed description are presented in terms of algorithms and symbolic representations of operations within a computer. These algorithmic descriptions and symbolic representations are the means used by those skilled in the data processing arts to convey the essence of their innovations to others skilled in the art. An algorithm is a series of defined steps leading to a desired end state or result. In example implementations, the steps carried out require physical manipulations of tangible quantities for achieving a tangible result.

Unless specifically stated otherwise, as apparent from the discussion, it is appreciated that throughout the description, discussions utilizing terms such as "processing," "computing," "calculating," "determining," "displaying," or the like, can include the actions and processes of a computer system or other information processing device that manipulates and transforms data represented as physical (electronic) quantities within the computer system's registers and memories into other data similarly represented as physical quantities within the computer system's memories or registers or other information storage, transmission or display devices.

Example implementations may also relate to an apparatus for performing the operations herein. This apparatus may be specially constructed for the required purposes, or it may include one or more general-purpose computers selectively activated or reconfigured by one or more computer programs. Such computer programs may be stored in a computer readable medium, such as a computer-readable storage medium or a computer-readable signal medium. A computer-readable storage medium may involve tangible mediums such as, but not limited to optical disks, magnetic disks, read-only memories, random access memories, solid state devices and drives, or any other types of tangible or non-transitory media suitable for storing electronic information. A computer readable signal medium may include mediums such as carrier waves. The algorithms and displays presented herein are not inherently related to any particular computer or other apparatus. Computer programs can involve pure software implementations that involve instructions that perform the operations of the desired implementation.

Various general-purpose systems may be used with programs and modules in accordance with the examples herein, or it may prove convenient to construct a more specialized apparatus to perform desired method steps. In addition, the example implementations are not described with reference to any particular programming language. It will be appreciated that a variety of programming languages may be used to implement the teachings of the example implementations as described herein. The instructions of the programming language(s) may be executed by one or more processing devices, e.g., central processing units (CPUs), processors, or controllers.

As is known in the art, the operations described above can be performed by hardware, software, or some combination of software and hardware. Various aspects of the example implementations may be implemented using circuits and logic devices (hardware), while other aspects may be implemented using instructions stored on a machine-readable medium (software), which if executed by a processor, would cause the processor to perform a method to carry out implementations of the present application. Further, some example implementations of the present application may be performed solely in hardware, whereas other example implementations may be performed solely in software. Moreover, the various functions described can be performed in a single unit, or can be spread across a number of components in any number of ways. When performed by software, the methods may be executed by a processor, such as a general purpose computer, based on instructions stored on a computer-readable medium. If desired, the instructions can be stored on the medium in a compressed and/or encrypted format.

Moreover, other implementations of the present application will be apparent to those skilled in the art from consideration of the specification and practice of the teachings of the present application. Various aspects and/or components of the described example implementations may be used singly or in any combination. It is intended that the specification and example implementations be considered as examples only, with the true scope and spirit of the present application being indicated by the following claims.

What is claimed is:

1. A method for a storage server, comprising:
   managing information associating an input/output (I/O) request operation type to one or more parameters indicative of availability of a cache type, the cache type comprising at least one of non-volatile memory (NVM) and dynamic random access memory (DRAM), the information generated from a detection of a hardware configuration of the storage server;
   selecting a cache mode for the I/O request operation type based on the one or more parameters indicative of the availability of the cache type associated with the I/O request operation type, and for receipt of an I/O request operation being the I/O request operation type, processing the I/O request operation according to the selected cache mode, wherein the selecting the cache mode for the I/O request operation type comprises:

for the one or more parameters indicative of availability of battery support for DRAM in the storage server, setting the cache mode to DRAM caching for the I/O request operation type of a read operation and a write operation;

for the one or more parameters indicative of non-availability of battery support for DRAM in the storage server and indicative of availability of NVM in the storage server, setting the cache mode to NVM caching for the I/O request operation type of the write operation and DRAM caching for the I/O request operation type of the read operation; and for the one or more parameters indicative of non-availability of NVM in the storage server and of non-availability of battery support for DRAM caching, set the cache mode to non-caching for the I/O request operation type of a write operation, wherein the non-caching for the I/O request operation type of the write operation comprises conducting a direct write to a storage device.

2. The method of claim 1, wherein the one or more parameters indicative of availability of the cache type comprises usable NVM cache capacity and usable DRAM cache capacity.

3. The method of claim 2, further comprising calculating the usable NVM cache capacity and the usable DRAM capacity from available NVM cache capacity and available DRAM cache capacity.

4. A non-transitory computer readable medium storing instructions for executing a process for a storage server, the instructions comprising:

managing information associating an input/output (I/O) request operation type to one or more parameters indicative of availability of a cache type, the cache type comprising at least one of non-volatile memory (NVM) and dynamic random access memory (DRAM), the information generated from a detection of a hardware configuration of the storage server;

selecting a cache mode for the I/O request operation type based on the one or more parameters indicative of the availability of the cache type associated with the I/O request operation type, and for receipt of an I/O request operation being the I/O request operation type, processing the I/O request operation according to the selected cache mode, wherein the selecting the cache mode for the I/O request operation type comprises:

for the one or more parameters indicative of availability of battery support for DRAM in the storage server, setting the cache mode to DRAM caching for the I/O request operation type of a read operation and a write operation;

for the one or more parameters indicative of non-availability of battery support for DRAM in the storage server and indicative of availability of NVM in the storage server, setting the cache mode to NVM caching for the I/O request operation type of the write operation and DRAM caching for the I/O request operation type of the read operation; and for the one or more parameters indicative of non-availability of NVM in the storage server and of non-availability of battery support for DRAM caching, set the cache mode to non-caching for the I/O request operation type of a write operation, wherein the non-caching for the I/O request operation type of the write operation comprises conducting a direct write to a storage device.

5. A storage server, comprising:

a memory configured to store information associating an input/output (I/O) request operation type to one or more parameters indicative of availability of a cache type, the cache type comprising at least one of non-volatile memory (NVM) and dynamic random access memory (DRAM), the information generated from a detection of a hardware configuration of the storage server; and a processor, configured to:

select a cache mode for the I/O request operation type based on the one or more parameters indicative of the availability of the cache type associated with the I/O request operation type, and for receipt of an I/O request operation being the I/O request operation type, process the I/O request operation according to the selected cache mode, wherein the select the cache mode for the I/O request operation type comprises:

for the one or more parameters indicative of availability of battery support for DRAM in the storage server, setting the cache mode to DRAM caching for the I/O request operation type of a read operation and a write operation;

for the one or more parameters indicative of non-availability of battery support for DRAM in the storage server and indicative of availability of NVM in the storage server, setting the cache mode to NVM caching for the I/O request operation type of the write operation and DRAM caching for the I/O request operation type of the read operation; and for the one or more parameters indicative of non-availability of NVM in the storage server and of non-availability of battery support for DRAM caching, setting the cache mode to non-caching for the I/O request operation type of a write operation, wherein the non-caching for the I/O request operation type of the write operation comprises conducting a direct write to a storage device.

6. The storage server of claim 5, wherein the one or more parameters indicative of availability of the cache type comprises usable NVM cache capacity and usable DRAM cache capacity.

7. The storage server of claim 6, wherein the processor is configured to calculate the usable NVM cache capacity and the usable DRAM capacity from available NVM cache capacity and available DRAM cache capacity.

* * * * *